US012727207B2

(12) United States Patent
Wang et al.

(10) Patent No.: US 12,727,207 B2
(45) Date of Patent: Sep. 1, 2026

(54) STRUCTURE OF TWO-DIMENSIONAL MATERIAL-BASED DEVICE HAVING AIR-GAP AND METHOD FOR PREPARING SAME

(71) Applicant: NANJING UNIVERSITY, Nanjing (CN)

(72) Inventors: Xinran Wang, Nanjing (CN); Dongxu Fan, Nanjing (CN); Weisheng Li, Nanjing (CN); Hao Qiu, Nanjing (CN); Yi Shi, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 384 days.

(21) Appl. No.: 18/505,955

(22) Filed: Nov. 9, 2023

(65) Prior Publication Data

US 2024/0105821 A1 Mar. 28, 2024

(30) Foreign Application Priority Data

Feb. 22, 2023 (CN) ......................... 202310173121.5

(51) Int. Cl.

| | |
|---|---|
| ***H01L 29/76*** | (2006.01) |
| ***H10D 48/36*** | (2025.01) |
| ***H10D 64/01*** | (2025.01) |
| ***H10D 64/66*** | (2025.01) |
| ***H10D 99/00*** | (2025.01) |

(52) U.S. Cl.

CPC ........... *H10D 48/362* (2025.01); *H10D 64/01* (2025.01); *H10D 64/679* (2025.01); *H10D 99/00* (2025.01)

(58) Field of Classification Search

CPC .. H10D 30/481; H10D 48/362; H10D 62/881; H10D 62/882; H10D 62/883; H10D 64/01; H10D 64/679; H10D 99/00

See application file for complete search history.

(56) References Cited

U.S. PATENT DOCUMENTS

| | | | | |
|---|---|---|---|---|
| 2008/0040697 | A1* | 2/2008 | Chidambarrao ..... | H10D 30/601 257/510 |
| 2018/0269301 | A1* | 9/2018 | Cheng .................. | H10D 30/024 |
| 2019/0198635 | A1* | 6/2019 | Zhang .................. | H10D 30/024 |
| 2022/0028999 | A1* | 1/2022 | Chang .................. | H10D 30/024 |
| 2022/0336625 | A1* | 10/2022 | Lin ...................... | H10D 30/024 |
| 2023/0068664 | A1* | 3/2023 | Lee .................... | H10D 30/0195 |

(Continued)

*Primary Examiner* — Jaehwan Oh

(74) *Attorney, Agent, or Firm* — JCIPRNET

(57) ABSTRACT

A structure of a two-dimensional material-based device having an air-gap and a method for preparing same comprises a substrate, a gate, an dielectric, a two-dimensional material-based film, and source and drain electrodes; the air-gap is formed between the two-dimensional material-based film and the side wall of the dielectric on the gate, or the air-gap is formed between the dielectric and the gate; two-dimensional material-based devices of the above structure utilize the ductility and flexibility of two-dimensional materials to reduce the coupling between the gate and the source/drain electrodes, thereby reducing the parasitic capacitance and the circuit delay; also, the structure ensures that a part of the contact region of the source and drain electrodes with the two-dimensional material can be controlled by the gate, and can thus avoid the reduction in electrical properties and keep a low resistance of the device.

7 Claims, 5 Drawing Sheets

(56) References Cited

U.S. PATENT DOCUMENTS

| | | | | |
|---|---|---|---|---|
| 2023/0077243 | A1* | 3/2023 | Xie | H10D 30/024 |
| 2023/0131403 | A1* | 4/2023 | Pritchard | H10D 30/0275 257/369 |
| 2023/0290831 | A1* | 9/2023 | Sharma | H10D 30/43 |
| 2023/0335432 | A1* | 10/2023 | Sun | H10D 30/024 |
| 2023/0411392 | A1* | 12/2023 | Zhou | H10D 30/014 |

* cited by examiner

STRUCTURE OF TWO-DIMENSIONAL MATERIAL-BASED DEVICE HAVING AIR-GAP AND METHOD FOR PREPARING SAME

CROSS-REFERENCE TO RELATED APPLICATIONS

This application claims priority to Chinese Patent Application Ser. No. CN2023101731215 filed on 22 Feb. 2023.

TECHNICAL FIELD

The present invention relates to the technical field of transistor-based electronic device preparation, and particularly, to a structure of a two-dimensional material-based device having an air-gap and a method for preparing same.

BACKGROUND

The latest International Technology Roadmap for Semiconductors (ITRS2.0) indicates that two-dimensional materials, represented by transition metal sulfides, feature high mobility, atomic-scale thickness, adjustable band gap, compatibility with silicon-based processes, and arbitrary stacking capacity, and are thus the most promising channel materials "candidates" for future high-performance circuits. At the International Electron Devices Meeting (IEDM) 2020, IMEC proposed that two-dimensional materials are the only choice for transistor channel materials of less than 2 nanometers. Through the development of the last decade, research based on two-dimensional materials has made important progress in material synthesis and key device techniques. However, two-dimensional material-based logic devices and integrated circuits (ICs) reported to date typically have operating frequencies less than Mhz, which are much lower than those of Si-based devices. For this reason, although individual transistors based on two-dimensional materials exhibit outstanding performance in terms of ohmic contacts, dielectric integration, and channel doping, the implementation of high-frequency devices and integrated circuits still faces great challenges due to the lack of stable fabrication processes with low variability and optimized device structures with minimized parasitic effects.

Conventional semiconductor devices based on two-dimensional materials reduce the parasitic capacitance by reducing the overlapping area of the gates and the source and drain electrodes, thereby resulting in two device structures. One is the self-aligned structure made by utilizing the height difference of the gate and the source and drain electrodes, which, however, cannot avoid the parasitic capacitance of the overlapping part of the source and drain electrodes with the side surface of the gate. As such, the thickness of the gate or the source and drain electrodes is limited, leading to large electrode resistance. The other one is a structure having an air-gap between the gate and the source and drain electrodes, which possesses the defect that in the air-gap, there's an absence of the gate to control the two-dimensional channel material, leading to significantly increased parasitic resistance and limited switching speed of the device. Therefore, there's a need for a novel device structure based on two-dimensional materials, which can ensure sufficient control of the channel by the gate and does not increase the resistance of the device, while reducing the parasitic capacitance.

SUMMARY

Objectives: The first objective of the present invention is to provide a structure of a two-dimensional material-based device having an air-gap with low parasitic capacitance and low parasitic resistance; the second objective of the present invention is to provide a method for preparing the structure.

Technical Scheme: Provided is a structure of a two-dimensional material-based device having an air-gap comprising a substrate, wherein a gate, an dielectric, a two-dimensional material-based film and source and drain electrodes are sequentially arranged on the upper side of the substrate, and an interior of the structure contains an air-gap spacer, i.e., the air-gap.

The dielectric is laid over the upper side of the gate in close fit; the two-dimensional material-based film is laid over the dielectric; the source and drain electrodes are laid over the two-dimensional material-based film; the two-dimensional material-based film and a side of the dielectric form an included angle, such that a part of the two-dimensional material-based film is supported; the air-gap spacer between the two-dimensional material-based film and the dielectric is the air-gap.

The dielectric is laid over the upper side of the gate; the two-dimensional material-based film is laid over the dielectric; the source and drain electrodes are laid over the two-dimensional material-based film; the dielectric and a side of the gate form an included angle, such that a part of the dielectric is supported; the air-gap spacer between the dielectric and the gate is the air-gap.

The substrate is a rigid insulating substrate or a thermoresistant insulating flexible substrate.

The rigid insulating substrate is made of silicon oxide, quartz, glass, aluminum oxide, hafnium oxide, zirconium oxide, silicon nitride, sapphire, calcium fluoride, or mica sheet.

The thermoresistant insulating flexible substrate is made of polyethylene terephthalate (PET), bis-benzocyclobutene (BCB), perfluoro(1-butenyl vinyl ether) polymer (CYTOP), spin-on glass (SOG), parylene, or polyethylene naphthalate (PEN) or polyimide (PI).

The dielectric is made of hexagonal boron nitride (BN), silicon oxide, hafnium oxide, aluminum oxide, zirconium oxide, hafnium zirconium oxide, aluminum scandium nitride, mica, calcium fluoride, strontium titanate, barium titanate, yttrium oxide, titanium oxide, silicon nitride, $CuInP_2S_6$, or tantalum oxide.

The two-dimensional material-based film is made of any one of a transition metal sulfide, a transition metal oxide, a transition metal selenide, an oxide semiconductor, graphene, a two-dimensional perovskite film, a topological insulator, or a Dirac semimetal.

The source and drain electrodes are made of one or a composition of more of a metal, a semimetal, a conductive oxide, a conductive nitride, or a conductive carbide.

The gate has a thickness of ≥10 nm.

The thickness of the dielectric and the thickness of the two-dimensional material-based film are less than the thickness of the gate.

The gate is made of one or a composition of more of a metal, a semimetal, a conductive oxide, a conductive nitride, or a conductive carbide.

The shape of the gate includes a circle, an omega shape, a rectangle, a trapezoid, or an inverted trapezoid.

The gas in the air-gap is identical to that of the external atmosphere.

Also provided is a method for preparing a structure of a two-dimensional material-based device having an air-gap, comprising:

(1) providing a substrate, and growing or depositing a gate on the substrate;

(2) growing or depositing an dielectric on the gate such that the dielectric and the gate are in close fit, and transferring a two-dimensional material-based film onto the dielectric such that an air-gap is formed between the two-dimensional material-based film and a side wall of the dielectric on the gate; or alternatively, transferring an dielectric onto the gate such that an air-gap is formed between the dielectric and the gate, and transferring, growing or depositing the two-dimensional material-based film on the dielectric; and (3) depositing a conductive material on the two-dimensional material-based film through electron-beam exposing or photolithography to form source and drain electrodes.

In step (1), the method for growing or depositing the gate on the substrate includes atomic layer deposition (ALD), electron beam evaporation (EBE), thermal evaporation, molecular beam epitaxy (MBE), or plasma-enhanced chemical vapor deposition (PECVD).

In step (2), the method for growing or depositing the dielectric on the gate includes atomic layer deposition (ALD), electron beam evaporation (EBE), chemical vapor deposition (CVD), plasma-enhanced chemical vapor deposition (PECVD), molecular beam epitaxy (MBE), magnetron sputtering, thermal evaporation, or pulsed laser deposition (PLD).

In step (2), the method for transferring the dielectric onto the gate includes PDMS-assisted transfer, aqueous solution-assisted transfer, alkali solution-assisted transfer, or acid solution-assisted transfer.

In step (2), the method for transferring the two-dimensional material-based film onto a rigid dielectric includes PDMS-assisted transfer, an aqueous solution-assisted transfer, or alkali-assisted transfer.

In step (2), the method for growing or depositing the two-dimensional material-based film onto a flexible dielectric includes atomic layer deposition (ALD), electron beam evaporation (EBE), thermal evaporation, molecular beam epitaxy (MBE), plasma-enhanced chemical vapor deposition (PECVD), metal organic chemical vapor deposition (MOCVD), or chemical vapor deposition (CVD).

In step (3), the method for depositing the conductive material on the two-dimensional material-based film as source and drain electrodes includes atomic layer deposition (ALD), electron beam evaporation (EBE), thermal evaporation, molecular beam epitaxy (MBE), or plasma-enhanced chemical vapor deposition (PECVD).

In step (3), a part of the source and drain electrodes overlaps with the gate, the dielectric and the two-dimensional material-based film simultaneously.

The simultaneous overlapping of the source and drain electrodes with the gate, the dielectric and the two-dimensional material-based film is an overlapping of ≥10 nm on both sides.

Beneficial effects: The present invention has the following remarkable advantages compared with the prior art:

(1) The structure provided herein reserves the overlapping region of the source and drain electrodes and the gate, and can achieve high on-state current, low contact resistance and high gate control capability. Also, the air-gap present between the gate and the dielectric or between the dielectric and the two-dimensional material-based film in the structure of the present invention reduces the parasitic capacitance. Therefore, the structure can improve the working frequency of the device, and further improve the working frequency of integrated circuits based on two-dimensional materials. The problem that a part of the channel in an existing top gate transistor having an air-gap cannot be controlled by the gate is also solved.

(2) The structure has broad application scenes and is compatible with most processes for two-dimensional material-based devices. The preparation process requires no additional processing or annealing procedures, or any additional patterning process, and can be implemented by directly transferring the film material for a flexible two-dimensional material-based film. For a two-dimensional material-based film requiring direct growing, the method can also be implemented by transferring a flexible dielectric.

DETAILED DESCRIPTION

The technical scheme of the present invention is further described below with reference to the drawings.

Example 1

Figure 1:
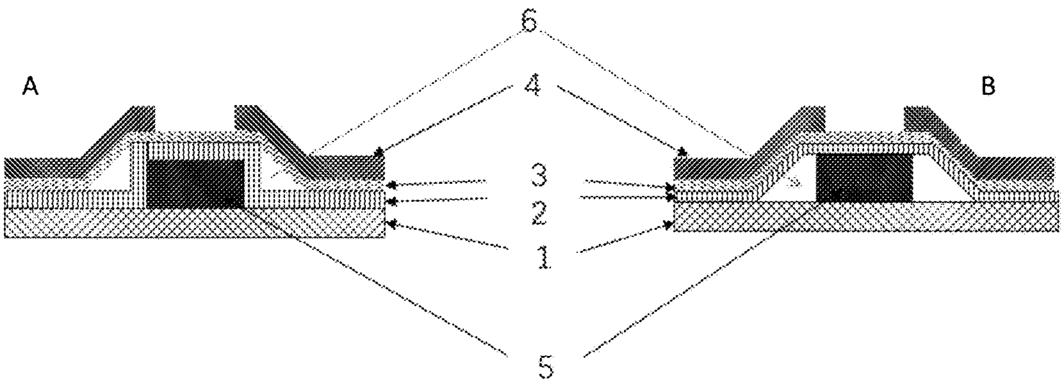
FIG. 1 is a structural view of the structure of a two-dimensional material-based device having an air-gap according to the present invention.

The present invention provides a structure of a two-dimensional material-based device having an air-gap, as shown in FIG. 1. FIG. 1 is a structural view of the structure according to the present invention, which includes two structures, wherein A illustrates a first structure of a two-dimensional material-based device, and B illustrates a second structure of a two-dimensional material-based device.

The first structure (A) is characterized in that the air-gap 6 is formed among the two-dimensional material-based film 3, the gate 5, and the substrate 1. The structure comprises the substrate 1. The gate 5, the dielectric 2, the two-dimensional material-based film 3, and the source and drain electrodes 4 are sequentially arranged on the substrate 1. The dielectric 2 is in close fit with the gate 5 and extends to the substrate 1. The two-dimensional material-based film 3 is laid over the dielectric 2, such that an included angle is formed between the two-dimensional material-based film 3 and the dielectric 2 and a part of the two-dimensional material-based film 3 is supported. The air-gap spacer formed between the two-dimensional material-based film 3 and the dielectric 2 is the air-gap 6. The source and drain electrodes 4 are laid over the two-dimensional material-based film 3.

The second structure (B) is characterized in that the air-gap 6 is formed among the dielectric 2, the gate 5, and the substrate 1. The structure comprises the substrate 1. The gate 5, the dielectric 2, the two-dimensional material-based film 3, and the source and drain electrodes 4 are sequentially arranged on the substrate 1. The dielectric 2 is laid on the gate 5 and the substrate 1, such that an included angle is formed between the dielectric 2 and a side of the gate 5 and a part of the dielectric 2 is supported. The air-gap spacer among the dielectric 2, the gate 5, and the substrate 1 is the air-gap 6. The two-dimensional material-based film 3 is laid or deposited on the dielectric 2. The two-dimensional material-based film (3) is in close fit with the dielectric 2. The source and drain electrodes 4 are laid over the two-dimensional material-based film 3.

Example 2

Figures 2, 3:
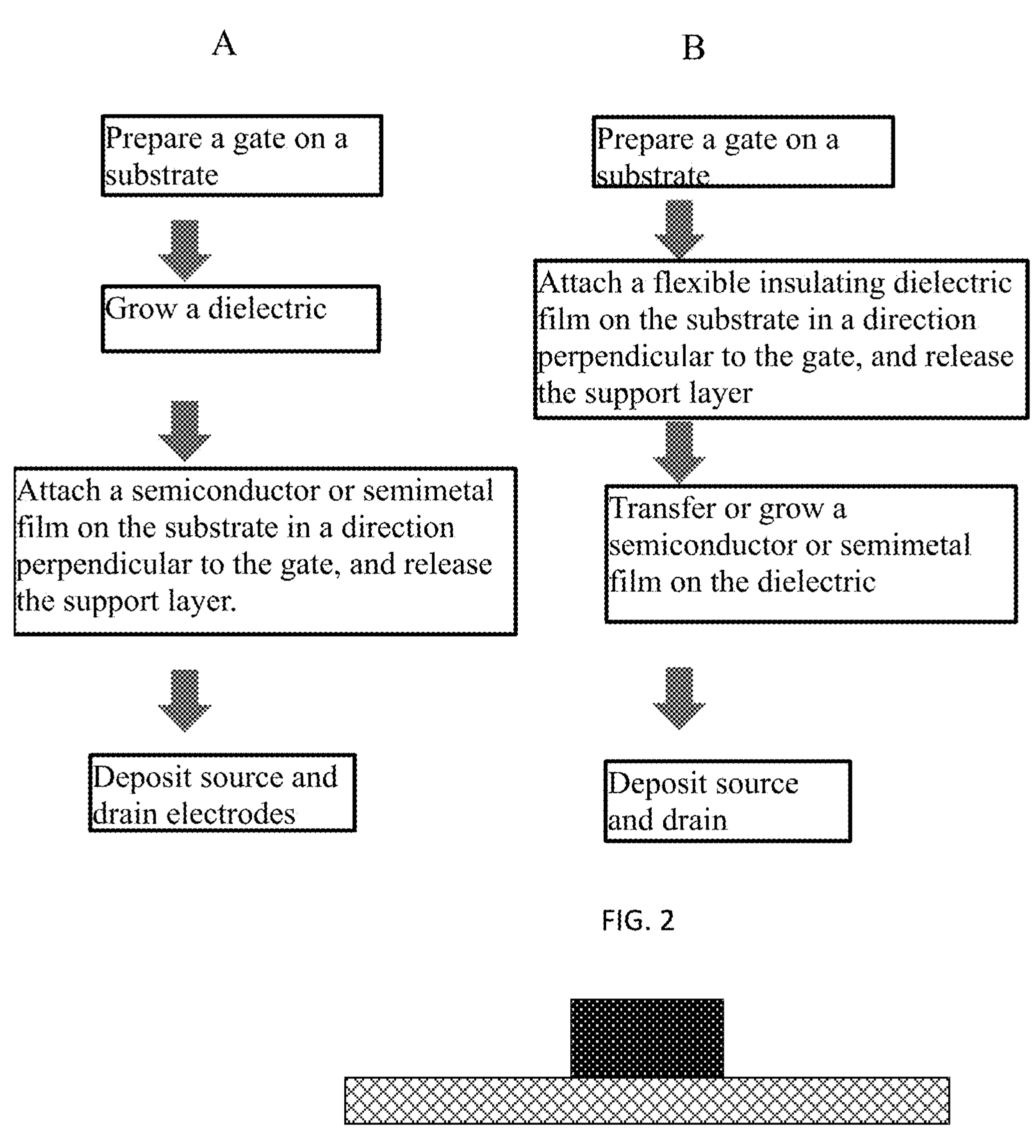
FIG. 2 is a flowchart of the preparation of the structure of a two-dimensional material-based device having an air-gap according to the present invention.
FIG. 3 is a schematic of a gate deposited or grown on a substrate according to the present invention.

FIG. 2 is a flowchart of the preparation of the structure according to the present invention. FIG. 2 illustrates the flowchart of the method for preparing the structure of a device consisting of a two-dimensional material-based film with an air-gap according to the present invention, including the preparation methods of two structures, wherein A is the flowchart for preparing the first structure according to Example 1, and B is the flowchart for preparing the second structure according to Example 1.

The method for preparing a structure of a two-dimensional material-based device having an air-gap comprises:

(1) providing a substrate 1, and growing or depositing a gate 5 on the substrate 1;

(2) growing or depositing an dielectric 2 on the gate 5 such that the dielectric 2 and the gate 5 are in close fit, and transferring a two-dimensional material-based film 3 onto the dielectric 2 such that an air-gap 6 is formed between the two-dimensional material-based film 3 and a side wall of the dielectric 2 on the gate 5; or alternatively, transferring an dielectric 2 onto the gate 5 such that an air-gap 6 is formed between the dielectric 2 and the gate 5, and transferring, growing or depositing the two-dimensional material-based film 3 on the dielectric 2; and (3) depositing a conductive material on the two-dimensional material-based film 3 through electron-beam exposing or photolithography to form source and drain electrodes 4.

The process of growing or depositing the gate 5 on the substrate 1 in step (1) is shown in FIG. 3. FIG. 3 is a schematic of the gate deposited or grown on the substrate according to the present invention. The substrate 1 may be a rigid insulating substrate or a thermoresistant insulating flexible substrate, wherein the rigid insulating substrate is made of silicon oxide, quartz, glass, aluminum oxide, hafnium oxide, zirconium oxide, silicon nitride, sapphire, calcium fluoride, or mica sheet, and the thermoresistant insulating flexible substrate is made of polyethylene terephthalate (PET), bis-benzocyclobutene (BCB), or polyethylene naphthalate (PEN) or polyimide (PI). Silicon oxide is selected in this example. The gate 5 has a thickness of greater than 10 nm, specifically, 40 nm in this example. The gate (5) is made of a metal, a semimetal, a conductive oxide, a conductive nitride, or a conductive carbide. In this example, gold and titanium are selected. The method for defining the pattern of the gate (5) includes electron-beam exposing, photolithography, or direct laser writing, and in this example, electron-beam exposing is selected. The method for growing or depositing the gate (5) includes atomic layer deposition (ALD), electron beam evaporation (EBE), thermal evaporation, molecular beam epitaxy (MBE), or plasma-enhanced chemical vapor deposition (PECVD). In this example, electron beam evaporation (EBE) is selected.

The methods for preparing the first structure A and the second structure B differ in step (2).

Figure 4:
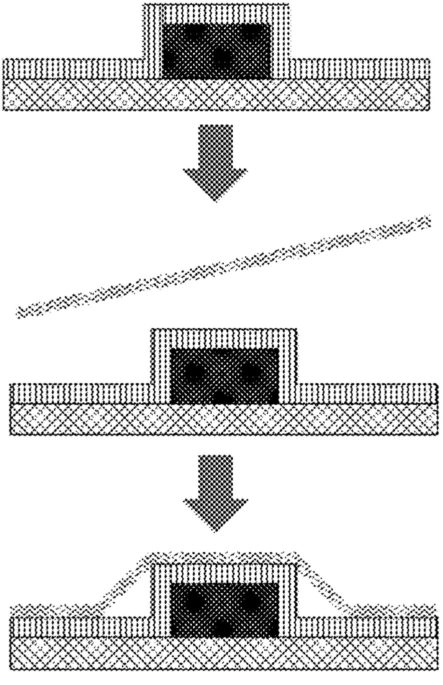
FIG. 4 is a schematic of the process of growing or depositing an dielectric on a substrate and attaching a two-dimensional material-based film to the substrate in a direction perpendicular to a gate.

In step (2) of the method for preparing the first structure A, the dielectric 2 is grown or deposited on the gate 5 such that the dielectric 2 and the gate 5 are in close fit, and the two-dimensional material-based film 3 is transferred onto the dielectric 2 such that an air-gap 6 is formed between the two-dimensional material-based film 3 and a side wall of the dielectric 2 on the gate 5, as shown in FIG. 4.

FIG. 4 is a schematic of the process of growing or depositing the dielectric on the substrate and attaching the two-dimensional material-based film 3 to the substrate 1 in a direction perpendicular to the gate 5. Referring to FIG. 4, first, according to step (1), the gate 5 is grown or deposited on the provided substrate 1, wherein the thickness of the gate 5 is 3 nm for Ti and 40 nm for Au. The dielectric 2 is grown or deposited on the gate 5 by a method including atomic layer deposition (ALD), electron beam evaporation (EBE), thermal evaporation, molecular beam epitaxy (MBE), or plasma-enhanced chemical vapor deposition (PECVD). In this example, atomic layer deposition (ALD) is selected. The dielectric 2 is made of hexagonal boron nitride (BN), silicon oxide, hafnium oxide, aluminum oxide, zirconium oxide, hafnium zirconium oxide, aluminum scandium nitride, mica, calcium fluoride, strontium titanate, barium titanate, yttrium oxide, titanium oxide, silicon nitride, $CuInP_2S_6$, or tantalum oxide. In this example, hafnium oxide ($HfO_2$) is selected. The growing thickness of the dielectric 2 is less than that of the gate 5. In this example, the growing thickness of the dielectric 2 is 7 nm. According to step (2), a continuous two-dimensional material-based film 3 is transferred from a growing substrate or a block material, and aligned with and laid on the target substrate 1 with the gate 5 overlaid with the dielectric 2. The continuous two-dimensional material-based film 3 is made of any one of a transition metal sulfide, a transition metal oxide, a transition metal selenide, an oxide semiconductor, graphene, a two-dimensional perovskite film, a topological insulator, or a Dirac semimetal. It should be noted that the thickness of the continuous two-dimensional material-based film 3 should be less than the thickness of the gate 5. In this example, a continuous single-layer molybdenum disulfide ($MoS_2$) film grown on a sapphire substrate by CVD is selected, wherein the thickness of the film is 0.7 nm.

The transfer method is determined according to the two-dimensional material-based film 3. In this example, electron beam gum is spin-coated on the $MoS_2$ film to serve as a spacer layer. A 90° C. thermal release tape is attached to the electron beam gum to serve as a support layer. The $MoS_2$ film is immersed in a NaOH solution, and after a period of time, the sapphire substrate below the $MoS_2$ film is etched, and the $MoS_2$ film attached to the thermal release tape can be removed from the NaOH solution. The $MoS_2$ film supported by the thermal release tape is aligned with the prepared substrate 1 and laid on the substrate 1 in a direction perpendicular to the width of the gate 5. After the $MoS_2$ film is laid on the substrate 1 with the 7-nm $HfO_2$ layer, the substrate 1 is heated to 90° C. to release the thermal release tape. Due to the flexibility of the $MoS_2$ film and the strong van der Waals force between the film and the substrate, the $MoS_2$ film is not in completely close fit with the metal gate 5 overlaid with the 7-nm $HfO_2$ layer. Instead, the film is in close fit with the metal gate 5 overlaid with the 7-nm $HfO_2$ layer at the top of the gate, and is supported on the side of the gate 5 at a certain angle and directly connected to the substrate 1. The air-gap 6 is formed among the $MoS_2$ film, the side wall of the gate 5, and the substrate 1. The $MoS_2$ film is then patterned using electron beam gum serving as the spacer layer, and the unrequired $MoS_2$ film is etched by reactive-ion etching (RIE). After that, the structure is soaked into an acetone solution at 90° C. to remove the residual electron beam gum.

In step (2) of the method for preparing the second structure B, the dielectric 2 is transferred onto the gate 5 such that the air-gap 6 is formed between the dielectric 2 and the gate 5. The two-dimensional material-based film 3 is transferred, grown, or deposited on the dielectric 2, as shown in FIG. 5.

Figure 5:
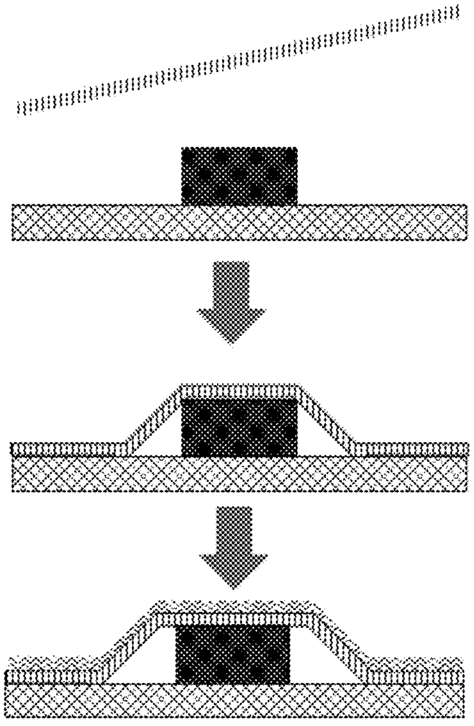
FIG. 5 is a schematic of the process of transferring and attaching an dielectric to a substrate in a direction perpendicular to a gate and growing or depositing a two-dimensional material-based film on the dielectric.

FIG. 5 is a schematic of the process of transferring and attaching an dielectric to a substrate in a direction perpendicular to a gate, releasing the support layer, and growing or depositing a two-dimensional material-based film on the dielectric. Referring to FIG. 5, first, according to step (1) for preparing the first structure, the gate 5 is grown or deposited on the provided substrate 1, wherein the thickness of the gate 5 is 3 nm for Ti and 40 nm for Au. According to step (2), a continuous dielectric (2) is transferred from a growing substrate or a block material, and aligned with and laid on the target substrate 1 overlaid with the gate 5. It should be noted that the thickness of the dielectric 2 should be less than that of the gate 5. In this example, hexagonal boron nitride (h-BN) is selected for the dielectric 2 with a thickness of 0.34 nm to 5 nm, depending on the number of layers of hexagonal boron nitride. The hexagonal boron nitride film on the SiO2 substrate is prepared by mechanical stripping. The hexagonal boron nitride film with a proper thickness is adhered to PDMS. The PDMS carrying the hexagonal boron nitride film is aligned to the substrate 1, and laid on the substrate 1 in a direction perpendicular to the width of the gate 5. Due to the flexibility of the h-BN film and the strong van der Waals force between the film and the substrate, the h-BN film is not in completely close fit with the metal gate 5. Instead, the film is in close fit with the metal gate 5 at the top of the gate, and is supported on the side of the gate 5 at a certain angle and directly connected to the substrate 1. The air-gap 6 is formed among the h-BN film, the side wall of the gate 5, and the substrate 1. The two-dimensional material-based film 3 is then transferred, deposited, or grown on the substrate overlaid with the dielectric 2. The method for growing or depositing the two-dimensional material-based film 3 includes atomic layer deposition (ALD), electron beam evaporation (EBE), thermal evaporation, molecular beam epitaxy (MBE), plasma-enhanced chemical vapor deposition (PECVD), or chemical vapor deposition (CVD). The method for transferring the two-dimensional material-based film 3 is identical to that of the first structure. The continuous two-dimensional material-based film 3 is made of any one of a transition metal sulfide, a transition metal oxide, a transition metal selenide, an oxide semiconductor, graphene, a two-dimensional perovskite film, a topological insulator, or a Dirac semimetal. It should be noted that the thickness of the continuous two-dimensional material-based film 3 should be less than the thickness of the gate 5. In this example, a continuous single-layer $MoS_2$ film grown by chemical vapor deposition (CVD) is selected, wherein the thickness of the film is 0.7 nm.

In step (3), photolithography, electron-beam exposing, or direct laser writing is performed on the two structures to define the pattern of the source and drain electrodes, and a conductive metal is further deposited or grown to serve as the source and drain electrodes 4. It should be noted that the pattern of the source and drain electrodes 4 should have a part overlaying the gate 5 and an overlapping region with the gate 5, the dielectric 2 and the two-dimensional material-based film 3, which is to ensure an efficient carrier injection from the source and drain electrodes to the two-dimensional material-based film 3. The source and drain electrodes 4 are made of a metal, a semimetal, a conductive oxide, a conductive nitride, or a conductive carbide. The method for growing or depositing the source and drain electrodes 4 includes atomic layer deposition (ALD), electron beam evaporation (EBE), thermal evaporation, molecular beam epitaxy (MBE), or plasma-enhanced chemical vapor deposition (PECVD). In this example, electron-beam exposing is selected for preparing the source and drain electrodes 4 with a channel length of 100 nm. The overlapping length on both sides of the metal gate 5 is 20 nm, and semimetal Sb and metal Au for electron beam evaporation (EBE) are selected for the source and drain electrodes 4 with a thickness of 20 nm for Sb and 20 nm for Au.

Figure 6:
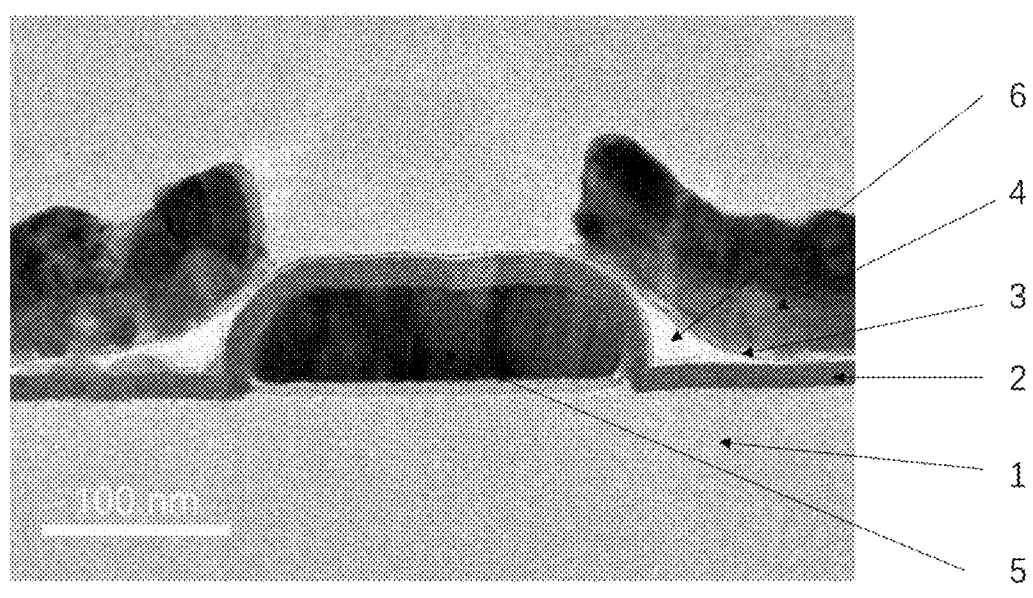
FIG. 6 is a TEM graph of a two-dimensional $MoS_2$-based device.

The first structure in this example was subjected to a transmission electron microscopy analysis, and the results are shown in FIG. 6. FIG. 6 is a TEM graph of the structure of a two-dimensional $MoS_2$-based device. The structure comprises a SiO2 substrate 1, a gate 5 composed of 3 nm of Ti and 40 nm of Au, a 7-nm dielectric 2 of $HfO_2$, a single-layer $MoS_2$ film as the channel material, source and drain electrodes 4 composed of 20 nm of Sb and 20 nm of Au, and an air-gap 6 formed among $MoS_2$, the gate and the substrate. It can be seen from FIG. 6 that the two-dimensional material-based device structure based on the two-dimensional material-based film described herein is successfully prepared. The device has the air-gap structure 6 and a reduced parasitic capacitance. Also, the two ends of the gate 5, the dielectric 2, the two-dimensional material-based film 3, and the source and drain electrodes 4 are partially overlapped, such that the gate 5 has a strong control capability on the semiconductor device, with improved carrier injection efficiency in the contact region and reduced the resistance of the device.

Figure 7:
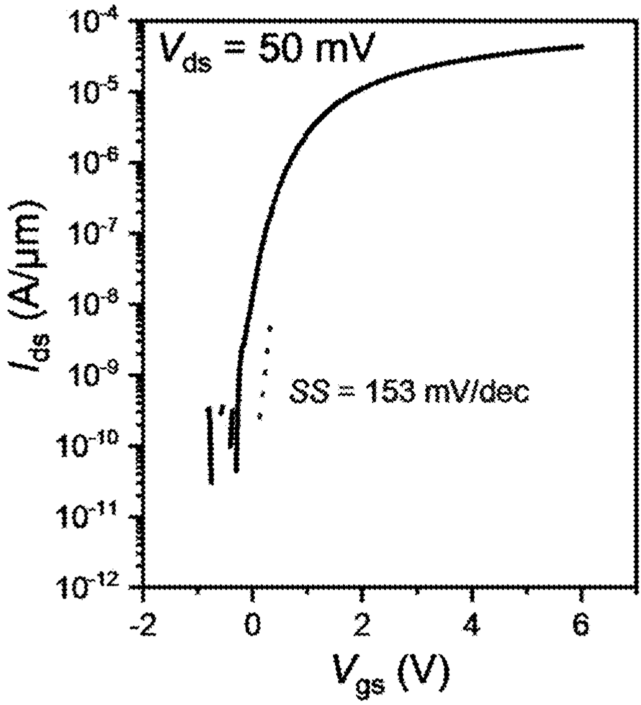
FIG. 7 is the electromigration profile of a two-dimensional $MoS_2$-based device in an electrical test.

The first structure in this example was subjected to an electrical test, and the results are shown in FIG. 7. The structure consists of 3 nm of Ti and 40 nm of Au as back gates, 7 nm of hafnium oxide as the dielectric 2, a single-layer continuous molybdenum disulfide film grown by CVD as the channel material, and 20 nm of Sb and 20 nm of Au as the source and drain electrodes 4. When the bias voltage Vds of the source and drain electrodes 4 was 0.05 V, the gate voltage Vgs was scanned from −1 V to 6 V, so as to give the migration profile of the device. As can be seen from FIG. 7, the on-state current of the device reached 43 μA/μm, and the off-state current was less than 100 pA at a gate voltage of 0 V. The current ratio of the on-state current to the off-state current of the device reached $10^6$, demonstrating that the structure of a two-dimensional material-based device disclosed herein has a strong gate control capability to ensure the high performance of the device while having an air-gap and thus a reduced parasitic capacitance. The subthreshold swing reached 153 mV/dec, suggesting that the device has a clean interface and the process does not introduce contaminants.

What is claimed is:

1. A structure of a two-dimensional material-based device having an air-gap comprising a substrate, wherein a gate, a dielectric, a two-dimensional material-based film and source and drain electrodes are sequentially arranged on the upper side of the substrate, and an interior of the structure contains an air-gap spacer, i.e., the air-gap, wherein the two-dimensional material-based film is made of any one of a transition metal sulfide, a transition metal oxide, a transition metal selenide, an oxide semiconductor, graphene, a two-dimensional perovskite film, a topological insulator, or a Dirac semimetal, and the source and drain electrodes are made of one or a composition of more of a metal, a semimetal, a conductive oxide, a conductive nitride, or a conductive carbide, wherein the gate has a thickness of >10 nm; the thickness of the dielectric and the thickness of the two-dimensional material-based film are less than the thickness of the gate;

the gate is made of one or a composition of more of a metal, a semimetal, a conductive oxide, a conductive nitride, or a conductive carbide; the shape of the gate includes a circle, an omega shape, a rectangle, a trapezoid, or an inverted trapezoid; the gas in the air-gap is identical to that of the external atmosphere.

2. The structure according to claim 1, wherein the dielectric is laid over the upper side of the gate in close fit; the two-dimensional material-based film is laid over the dielectric; the source and drain electrodes are laid over the two-dimensional material-based film; the two-dimensional material-based film and a side of the dielectric form an included angle, such that a part of the two-dimensional material-based film is supported; the gap between the two-dimensional material-based film and the dielectric is the air-gap.

3. The structure according to claim 1, wherein the dielectric is laid over the upper side of the gate; the two-dimensional material-based film is laid over the dielectric; the source and drain electrodes are laid over the two-dimensional material-based film; the dielectric and a side of the gate form an included angle, such that a part of the dielectric is supported; the gap between the dielectric and the gate is the air-gap.

4. The structure according to claim 1, wherein the substrate is a rigid insulating substrate or a thermoresistant insulating flexible substrate; the dielectric is made of hexagonal boron nitride, silicon oxide, hafnium oxide, aluminum oxide, zirconium oxide, hafnium zirconium oxide, aluminum scandium nitride, mica, calcium fluoride, strontium titanate, barium titanate, yttrium oxide, titanium oxide, silicon nitride, $CuInP_2S_6$, or tantalum oxide.

5. A method for preparing the structure according to claim 1, comprising:

(i) providing a substrate, and growing or depositing a gate on the substrate;

(ii) growing or depositing a dielectric on the gate such that the dielectric and the gate are in close fit, and transferring a two-dimensional material-based film onto the dielectric such that an air-gap is formed between the two-dimensional material-based film and a side wall of the dielectric on the gate; or alternatively, transferring a dielectric onto the gate such that an air-gap is formed between the dielectric and the gate, and transferring, growing or depositing the two-dimensional material-based film on the dielectric; and (iii) depositing a conductive material on the two-dimensional material-based film through electron-beam exposing or photolithography to form source and drain electrodes, wherein the method for growing or depositing the gate on the substrate includes atomic layer deposition, electron beam evaporation, thermal evaporation, molecular beam deposition, or plasma-enhanced chemical vapor deposition, and the method for depositing the conductive material on the two-dimensional material-based film as source and drain electrodes includes atomic layer deposition, electron beam evaporation, thermal evaporation, molecular beam epitaxy, or plasma-enhanced chemical vapor deposition; a part of the source and drain electrodes overlaps with the gate, the dielectric and the two-dimensional material-based film simultaneously.

6. The method according to claim 5, wherein in step (ii), the method for growing or depositing the dielectric on the gate includes atomic layer deposition, electron beam evaporation, chemical vapor deposition, plasma-enhanced chemical vapor deposition, molecular beam epitaxy, magnetron sputtering, thermal evaporation, or pulsed laser deposition; the method for transferring the dielectric onto the gate includes PDMS-assisted transfer, aqueous solution-assisted transfer, alkali solution-assisted transfer, or acid solution-assisted transfer.

7. The method according to claim 5, wherein in step (ii), the method for transferring the two-dimensional material-based film onto a rigid dielectric includes PDMS-assisted transfer, an aqueous solution-assisted transfer, or alkali-assisted transfer; the method for growing or depositing the two-dimensional material-based film onto a flexible dielectric includes atomic layer deposition, electron beam evaporation, thermal evaporation, molecular beam epitaxy, plasma-enhanced chemical vapor deposition, metal organic chemical vapor deposition, or chemical vapor deposition.

* * * * *